(12) United States Patent
Brake et al.

(10) Patent No.: US 9,082,713 B2
(45) Date of Patent: Jul. 14, 2015

(54) METHOD OF GRINDING WAFER STACKS TO PROVIDE UNIFORM RESIDUAL SILICON THICKNESS

(71) Applicant: Strasbaugh, San Luis Obispo, CA (US)

(72) Inventors: Thomas Brake, San Luis Obispo, CA (US); Thomas A. Walsh, San Luis Obispo, CA (US)

(73) Assignee: Strasbaugh, San Luis Obispo, CA (US)

( * ) Notice: Subject to any disclaimer, the term of this patent is extended or adjusted under 35 U.S.C. 154(b) by 0 days.

(21) Appl. No.: 14/525,115

(22) Filed: Oct. 27, 2014

(65) Prior Publication Data

US 2015/0118826 A1  Apr. 30, 2015

Related U.S. Application Data

(60) Provisional application No. 61/895,862, filed on Oct. 25, 2013.

(51) Int. Cl.
| | | |
|---|---|---|
| *H01L 21/30* | (2006.01) | |
| *H01L 21/46* | (2006.01) | |
| *H01L 21/304* | (2006.01) | |
| *H01L 21/02* | (2006.01) | |
| *H01L 21/683* | (2006.01) | |

(52) U.S. Cl.
CPC ........ *H01L 21/304* (2013.01); *H01L 21/02013* (2013.01); *H01L 21/02016* (2013.01); *H01L 21/02021* (2013.01); *H01L 21/6835* (2013.01)

(58) Field of Classification Search
CPC ................ H01L 21/02002; H01L 21/6835; H01L 21/302; H01L 21/52; H01L 2221/68318; H01L 2221/68327; H01L 2221/67; H01L 2221/683; H01L 24/97; H01L 23/49827; H01L 25/043; H01L 25/0657; H01L 25/0756; H01L 25/117; H01L 25/074
USPC ......... 438/455, 458, 459, 107, 106, 109, 110, 438/113, 118; 257/686, 723, 783
See application file for complete search history.

(56) References Cited

U.S. PATENT DOCUMENTS

| | | | | |
|---|---|---|---|---|
| 7,795,113 B2 * | 9/2010 | Swinnen et al. | ............... | 438/458 |
| 8,466,041 B2 * | 6/2013 | Kuroda et al. | ................. | 438/459 |
| 2007/0093040 A1 * | 4/2007 | Sekiya | ............................ | 438/460 |
| 2012/0238057 A1 * | 9/2012 | Hu et al. | ........................ | 438/107 |
| 2014/0144593 A1 * | 5/2014 | Dang et al. | ..................... | 156/712 |
| 2014/0147986 A1 * | 5/2014 | Dang et al. | ..................... | 438/458 |
| 2014/0273354 A1 * | 9/2014 | Ramaswami et al. | ......... | 438/126 |

* cited by examiner

*Primary Examiner* — Thanh Y Tran
(74) *Attorney, Agent, or Firm* — K. David Crockett, Esq.; Crockett & Crockett, PC (57) ABSTRACT

A method of processing a device wafer in a wafer stack by chucking the wafer stack device side down and grinding the exposed side of the carrier wafer to parallel with the device wafer, and thereafter flipping the wafer stack and chucking the wafer stack carrier side down and grinding residual silicon from the device wafer.

1 Claim, 9 Drawing Sheets

METHOD OF GRINDING WAFER STACKS TO PROVIDE UNIFORM RESIDUAL SILICON THICKNESS

This application claims priority to U.S. Provisional Application 61/895,862, filed Oct. 25, 2013.

FIELD OF THE INVENTIONS

The inventions described below relate the field of wafer grinding.

BACKGROUND OF THE INVENTIONS

Wafer stacking refers to the process of adhering a device wafer (a silicon wafer with a device, or a device layer which is to form a layer of a multi-layer device) to a carrier wafer. An assembly of a processed wafer (with devices) glued to a carrier wafer used to support the processed wafer while it is manipulated is referred to as a stacked wafer. The carrier wafer is used only for handling purposes, and is removed and discarded after the device wafer is processed. Stacked wafers are commonly assembled and used during the manufacture of processed wafers incorporating "thru silicon vias" into their design. Thru silicon vias (TSV's) are metal (often Cu) wires embedded in the device wafer that allow connection to other device wafers, so that several device wafers may be stacked, one on top of the other. The device wafer will eventually be substantially thinned—typically thinned to less than 100 um during grinding and polishing to expose the TSV's. Because it is very thing, the device wafer must be supported by a carrier wafer to avoid damaging or destroying it during grinding and polishing needed to expose the TSV's. The carrier wafer is glued to the device wafer, and provides substantial support for the device wafer.

Through silicon vias are formed by etching blind holes in silicon, coating the holes with silicon oxide, and filling those holes with copper. A device layer is then built up over the copper filled TSV's. The copper TSV's are thus buried deep in the device wafer, and must be uncovered so that they can be connected, eventually, to another device wafer. The TSV's are uncovered by grinding and polishing. The bulk of the silicon covering the TSV's is quickly removed by grinding, until most of the silicon is removed and the TSV's are covered only by a very thin layer of remaining silicon. This layer is not removed by grinding so as to avoid smearing copper over the silicon, which would contaminate the silicon. To expose the vias, the remaining thin layer of silicon is removed by etching or polishing, so that the vias protrude slightly (a few microns) from the silicon layer. Then an additional layer of silicon oxide is deposited on the wafer, covering the entire wafer surface and the exposed vias. Next, an additional polishing step is used to remove the silicon oxide from the via tips without removing the silicon oxide from the remaining silicon. The silicon oxide prevents any copper smear from contaminating the silicon of the device wafer. In this condition, the device wafer may be stacked together with additional device wafers to create an integrated circuit with several layers of devices.

The device wafer and TSV's should be as flat as possible to allow the most compact stacking, and avoid defects in a final assembly of several wafers. However, the several surfaces of the device wafer, carrier wafer, and the glue used to join them together are not perfectly flat. When the stacked wafer is drawn onto the chuck, with the carrier wafer in contact with the chuck, the contacting surface of the carrier wafer is pulled perfectly flat. The overlying layers are thus deformed by any unevenness or dis-uniformities in the flatness or run out, such that the back surface of the device wafer is not flat, and conforms to any bumps and unevenness in the carrier wafer, adhesive layer, and device layer. Thus, the tips of the copper TSV's are not all the same height, and thus an excess of device wafer silicon must be left on the device wafer in the grinding step to avoid smearing. This also leads to inconsistent Remaining Silicon Thickness.

SUMMARY

The devices and methods described below provide for more uniform grinding of device wafer silicon needed to remove silicon, and allows more complete grinding to leave a consistent and thinner residual silicon thickness above TSV's than is possible under current methods. The consistent RST makes it possible to grind of the RST across the entire wafer more closely without inadvertently exposing some of the copper TSV's and contaminating the device wafer silicon. The method includes gluing a carrier wafer to the front side of a device wafer, leaving the back side silicon of the device wafer exposed. Thereafter, the wafer stack is mounted to the chuck, with the device wafer backside pulled down on the chuck, leaving the exposed side of the carrier wafer exposed to a grinder. The carrier wafer is then ground till flat and smooth, and perfectly parallel to the device wafer silicon face, notwithstanding any unevenness of the intervening layer surfaces. After the carrier wafer surface is ground flat while the stack is chucked, the wafer stack is released from the chuck, cleaned, and the mounted to the chuck with the carrier wafer exposed surface pulled down on the chuck, so that the device wafer silicon is exposed to the grinder. Then the device wafer silicon is ground to remove much of the silicon, leaving as little of the silicon as possible without risking exposing the copper TSV's. Because the carrier wafer is ground to parallel with the device wafer backside, subsequent grinding of the backside to reveal the TSV's may remove more of the base layer, leaving less RST to be removed in a subsequent polishing step.

DETAILED DESCRIPTION OF THE INVENTIONS

Figure 1:
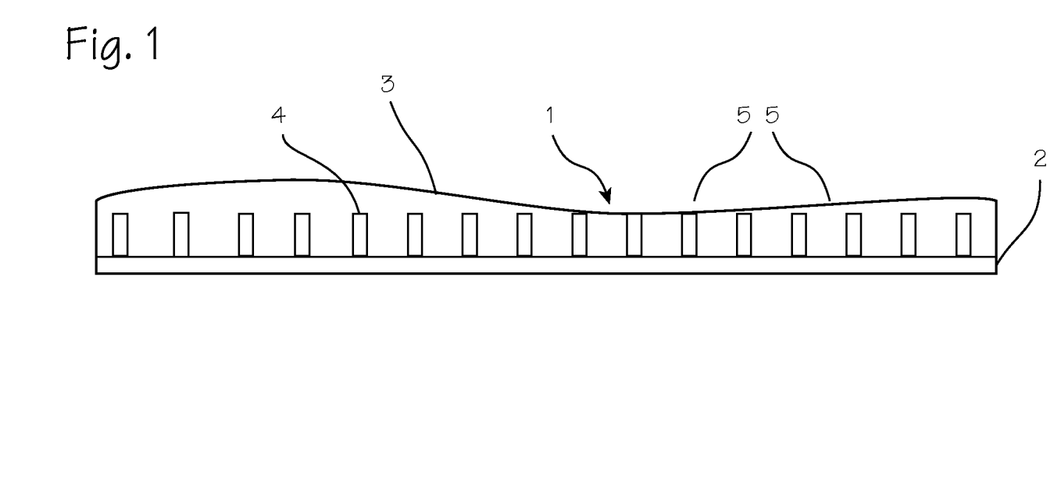
FIG. 1 illustrates a device wafer with a device layer, through silicon vias and a base layer of silicon with an inconsistent residual silicon thickness.

FIG. 1 illustrates a device wafer 1 which comprises a device layer 2 and a base layer of silicon 3, with through silicon vias (TSV's) 4 covered with a residual silicon thickness (RST) 5. The device layer is quite complex, including numerous circuit elements built up upon the silicon of the base layer (before the base layer is ground to the level shown). The base layer is characterized by the residual silicon thickness, which in this illustration is quite inconsistent, and may exhibit thickness variations of several microns (um). While workable, the inconsistency of the RST is the root of several problems including excess thickness to be removed in a polishing step, potential grinding through to the copper vias which leads to contamination of the silicon, and inconsistent or failed connection to other device wafers in a final product.

Figure 2:
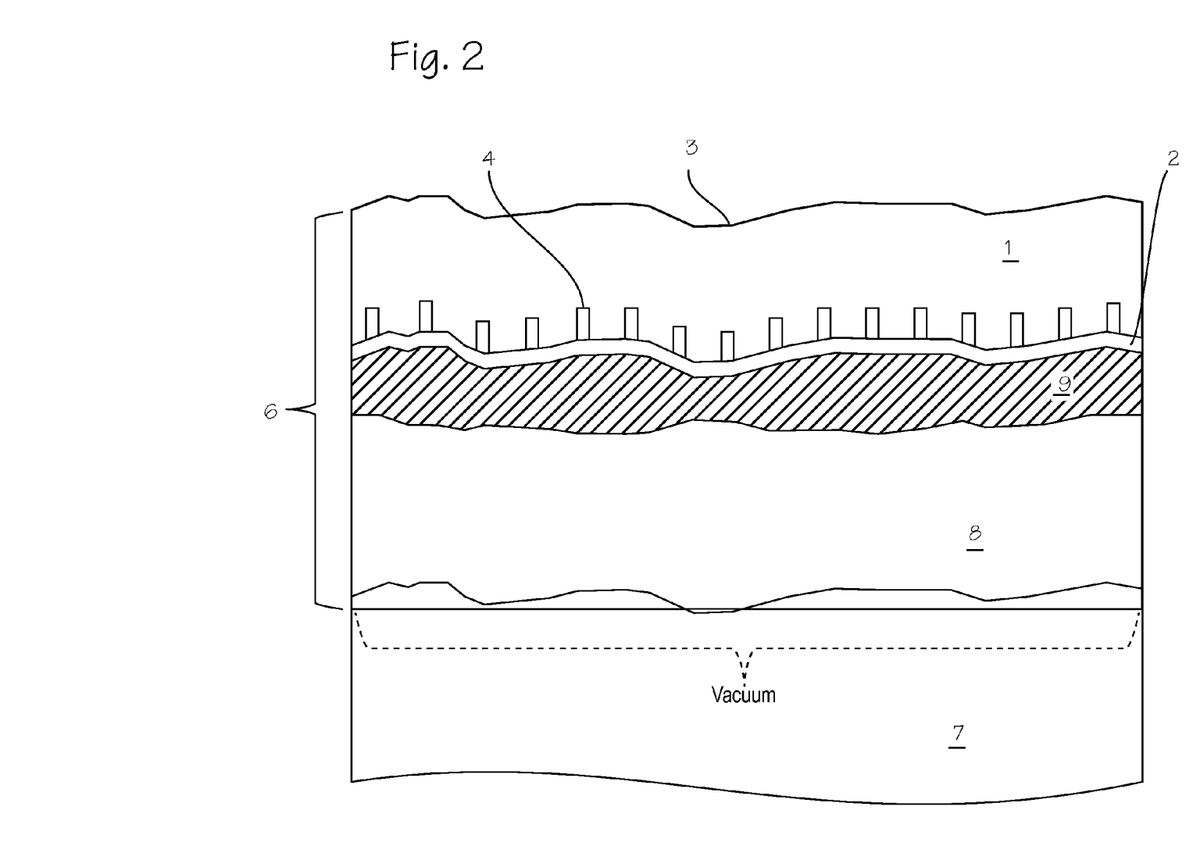
FIG. 2 illustrates a wafer stack mounted on vacuum chuck, according to a prior art method.

FIG. 2 illustrates a wafer stack 6 mounted on vacuum chuck 7, according to a prior art method. The wafer stack includes the device wafer 1, which includes the device layer 2, TSV's 4 and base layer of silicon 3 of FIG. 1. The base layer is in the condition before the base layer of silicon 3 is ground away, so that in this FIG. 2 the base layer is thicker and the TSV's are covered by this thick base layer. The wafer stack 6 also includes a carrier wafer 8, which is glued to the device wafer (specifically, to the front side, or device side, of the device wafer) with a layer of adhesive 9. The carrier wafer is scrap (akin to a glue block or waste block used between the chuck of a lathe and a wood work piece), and is attached to the device wafer to support it during handling and processing and removed and discarded afterwards. The carrier wafer is preferably very flat and uniform, but typically has a surface that varies a few microns. The adhesive layer is even more uneven, and varies by as much as 10 to 15 microns. It is hard and uneven. When the carrier wafer is pulled down onto the chuck, the uneven features of the adhesive layer and the carrier wafer are imposed on the device wafer, leaving the TSV's at variable height.

Figure 3:
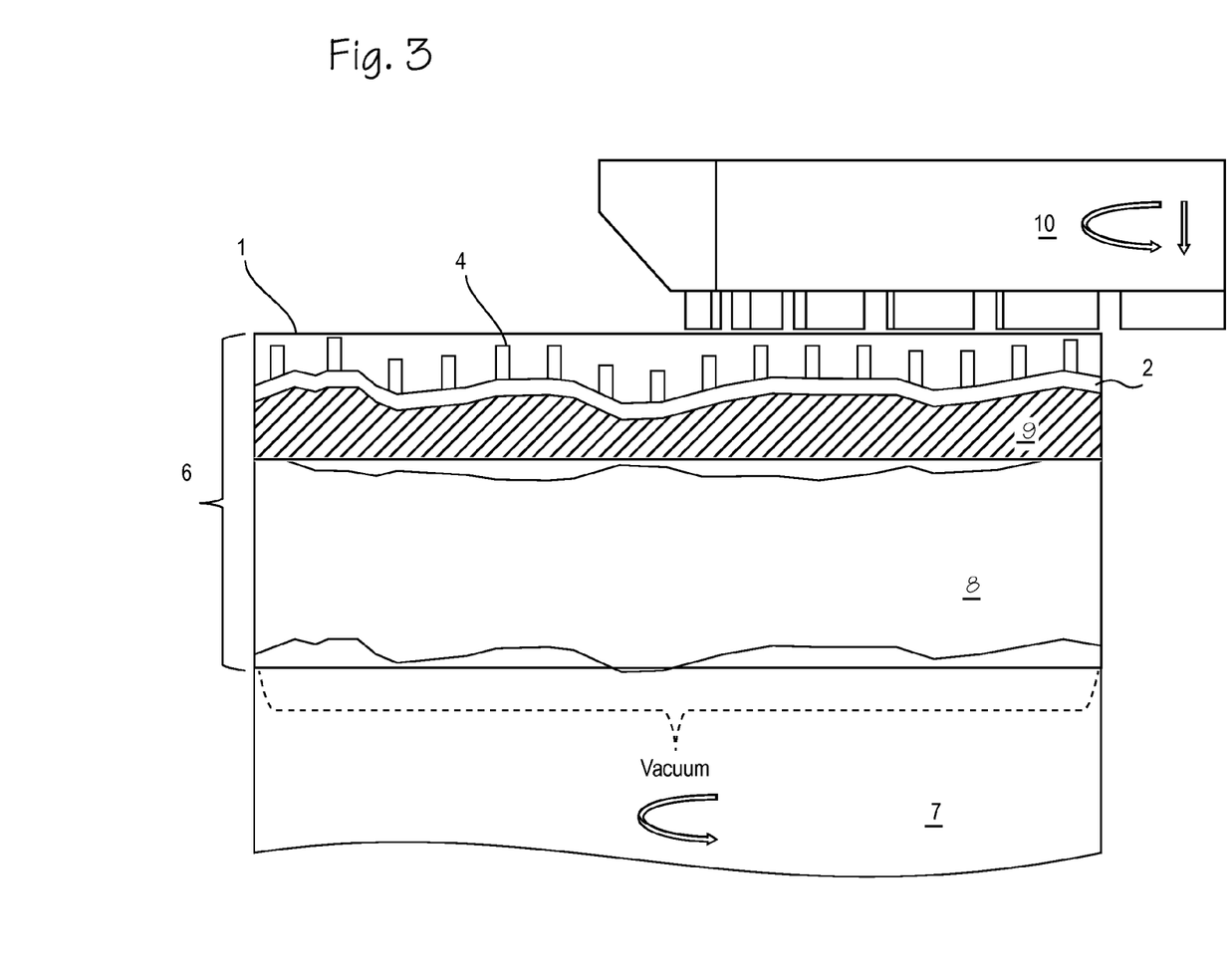
FIG. 3 illustrates a wafer stack on a vacuum chuck undergoing grinding, according to a prior art method.
Figure 4:
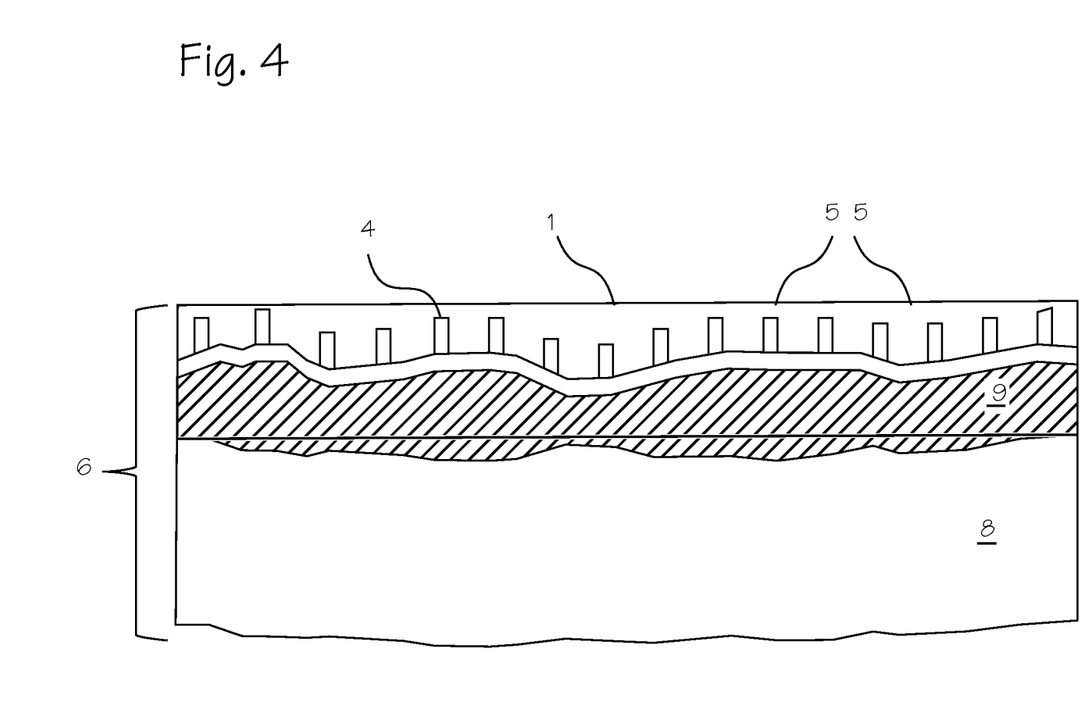
FIG. 4 illustrates the wafer stack when removed from the grinder chuck after removal of the base layer by grinding.

FIG. 3 illustrates a wafer stack on a vacuum chuck undergoing grinding, according to a prior art method. A grind wheel 10 is used to remove the bulk of the base layer. However, to avoid grinding through to any of the TSV's, the grinding must be stopped at a level that leaves excess RST over many of the TSV's. The wafer stack is then removed from the grinder chuck, and appears as shown in FIG. 4. The product of FIG. 4 is finished by several additional steps, including deposition of an oxide layer and polishing to remove more of the base layer until the tips of the TSV's are exposed and protrude from the base layer. As illustrated, when not restrained by the chuck, the wafer stack and each layer may be bowed or warped.

Figure 5:
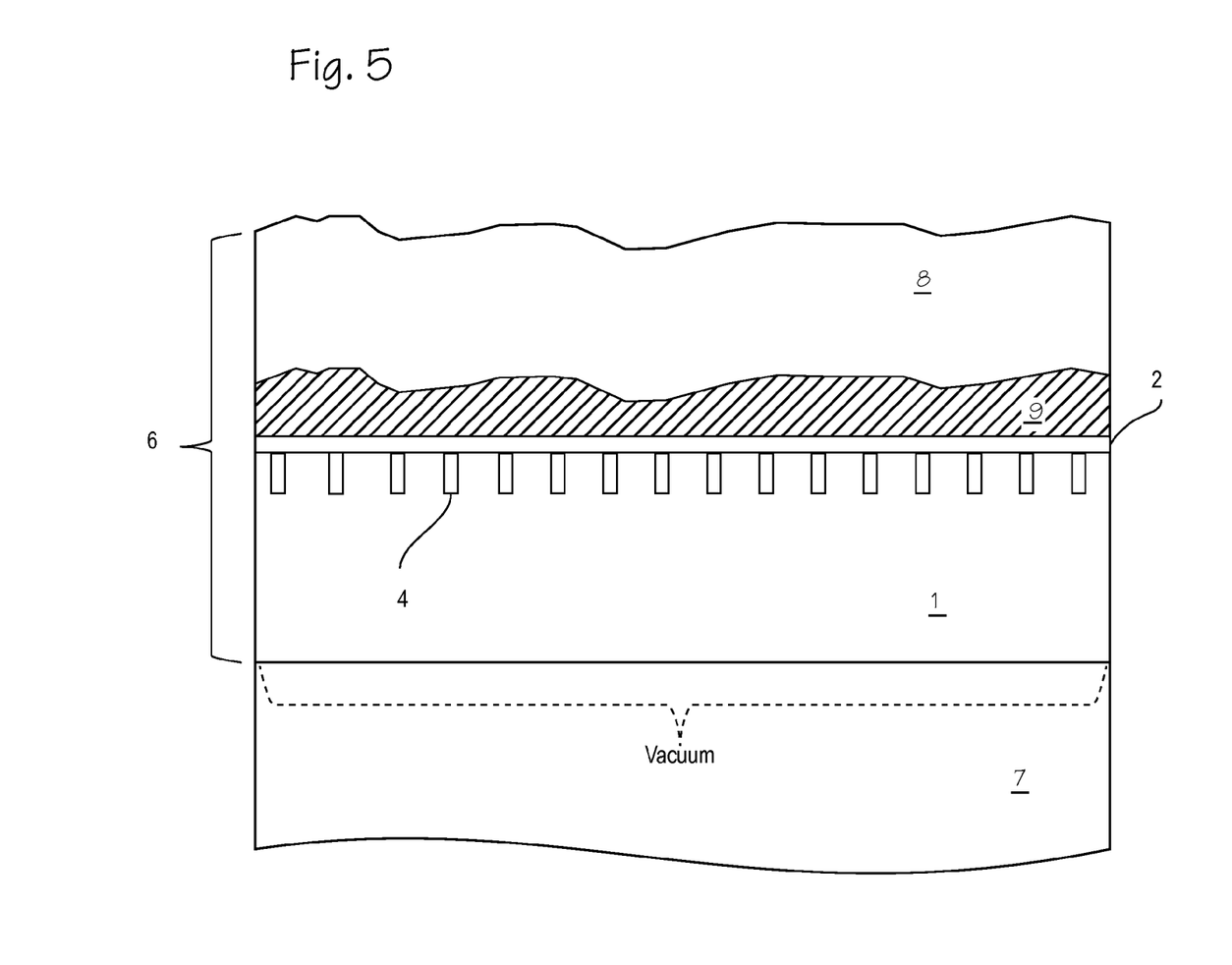
FIG. 5 illustrates the new method of removing the base layer.
Figure 6:
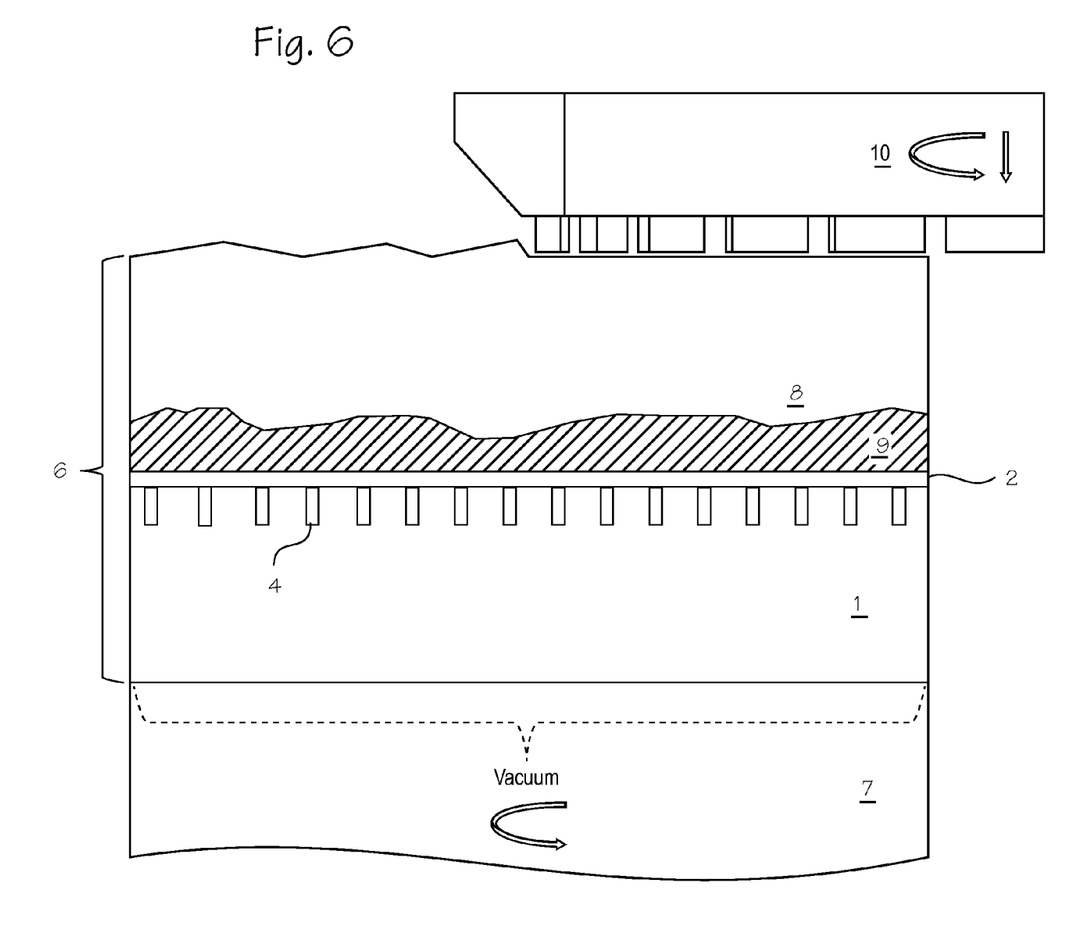
FIG. 6 illustrates the step of touch-up grinding of the carrier wafer exposed surface.

FIG. 5 illustrates the new method of removing the base layer. In FIG. 5, the wafer stack is flipped, so that the device wafer is underneath the carrier wafer. The stack is mounted to the chuck with the back side of the device layer facing the chuck. The stack is pulled down to the chuck. Assuming that the process started with a flat base layer, the device layer remains flat in this step as well, and the minor unevenness of the device wafer and major unevenness of the adhesive layer is transferred to the exposed side of the carrier wafer. FIG. 6 illustrates the step of touch-up grinding of the carrier wafer exposed surface. With the wafer stack pulled down to the chuck, with the base layer backside in contact with the chuck surface, the exposed side of the carrier wafer is ground flat. This results in a wafer stack in which the exposed side of the carrier wafer is flat, and parallel to the backside of the device wafer.

Figure 7:
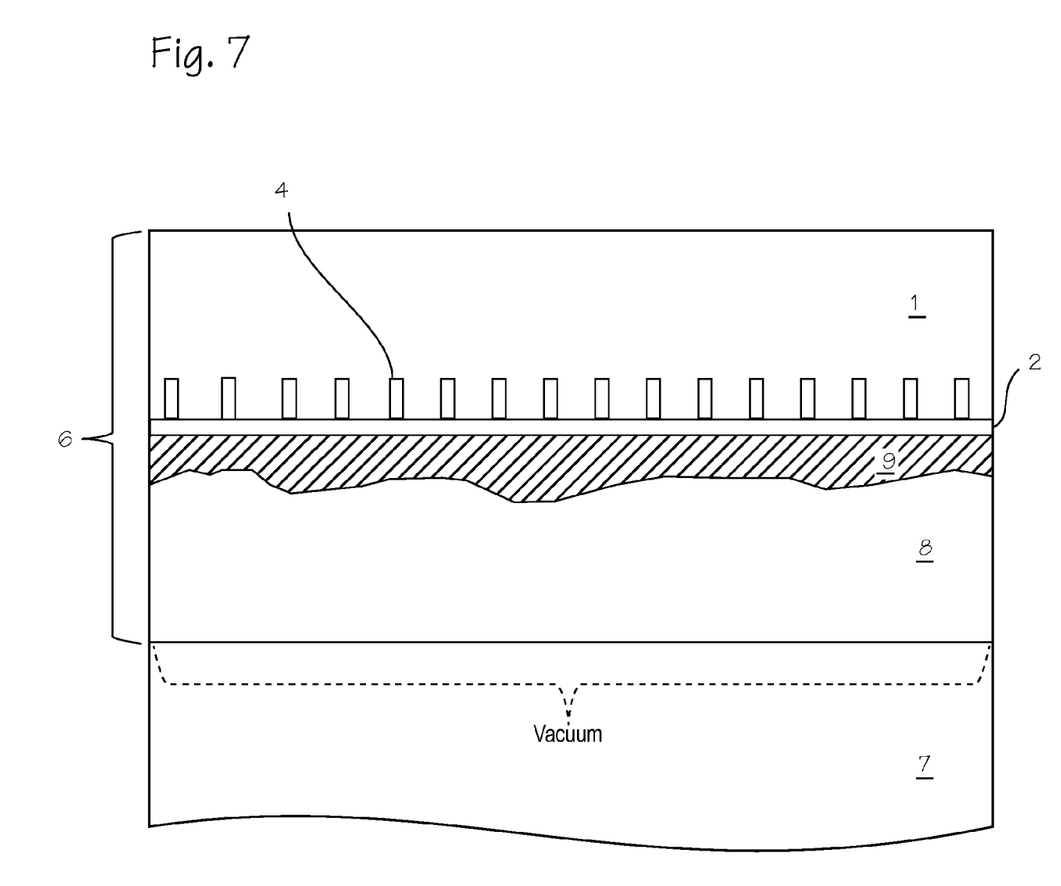
FIG. 7 illustrates the pre-ground wafer stack on a chuck.
Figure 8:
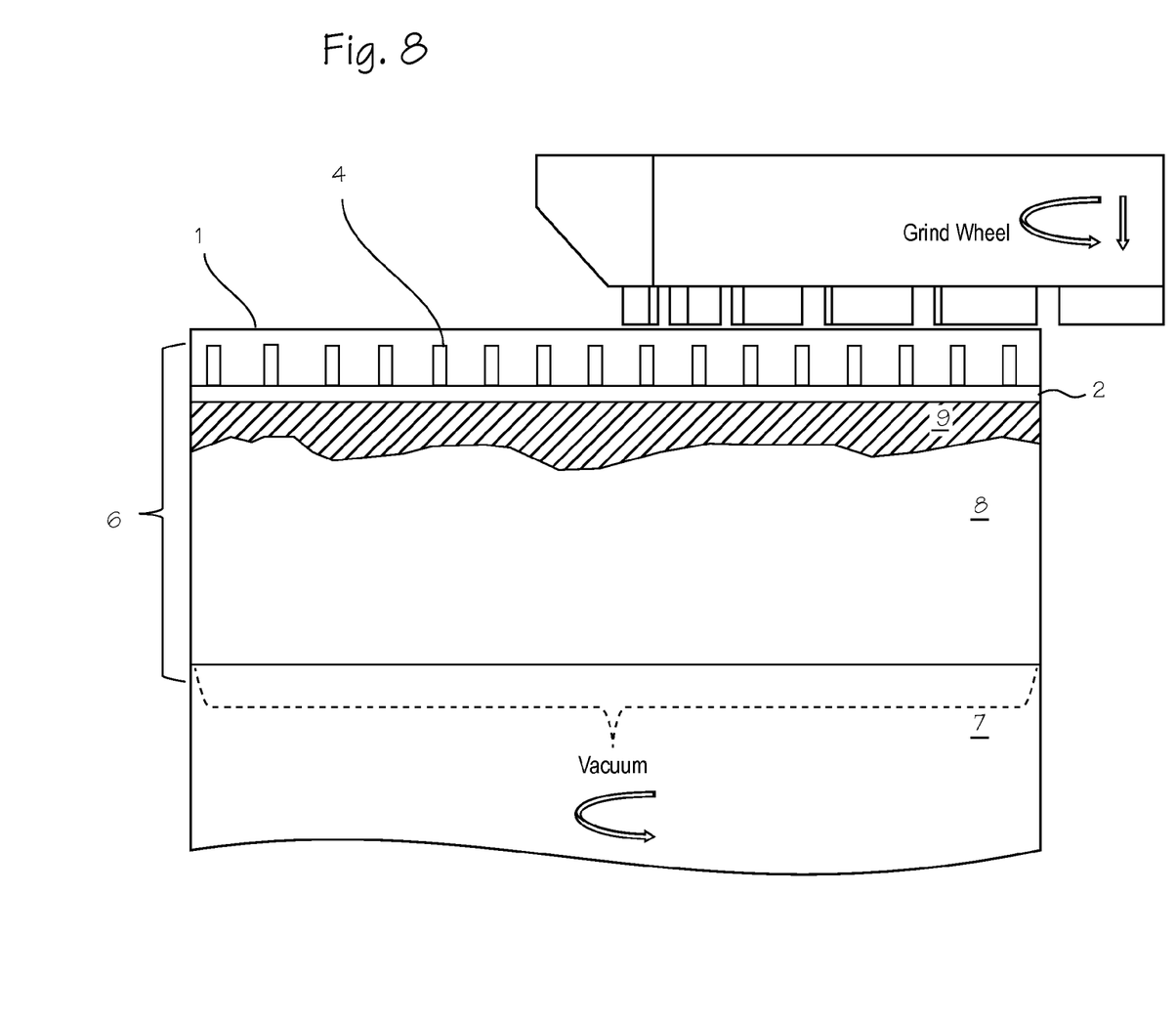
FIG. 8 illustrates a wafer stack on a vacuum chuck undergoing grinding of the base layer, according to the new method.

FIG. 7 illustrates the pre-ground wafer stack on a chuck. Because the carrier wafer has been ground flat with respect to the base layer, when the stack is flipped and pulled down, carrier wafer down, the TSV's are aligned with their tips at the same height, and the base layer backside flat and uniformly thick. FIG. 8 illustrates a wafer stack on a vacuum chuck undergoing grinding of the base layer, according to the new method with the pre-ground wafer stack on a chuck, and the carrier wafer exposed surface now in contact with the chuck. Because the TSV's are all aligned vertically, with their tips at the same height relative to the grinder surface and the chuck, the base layer can be removed more completely, leaving just enough residual silicon over the tips of the TSV's to avoid smearing. The TSV's can be approached much more closely than in the prior art method.

Figure 9:
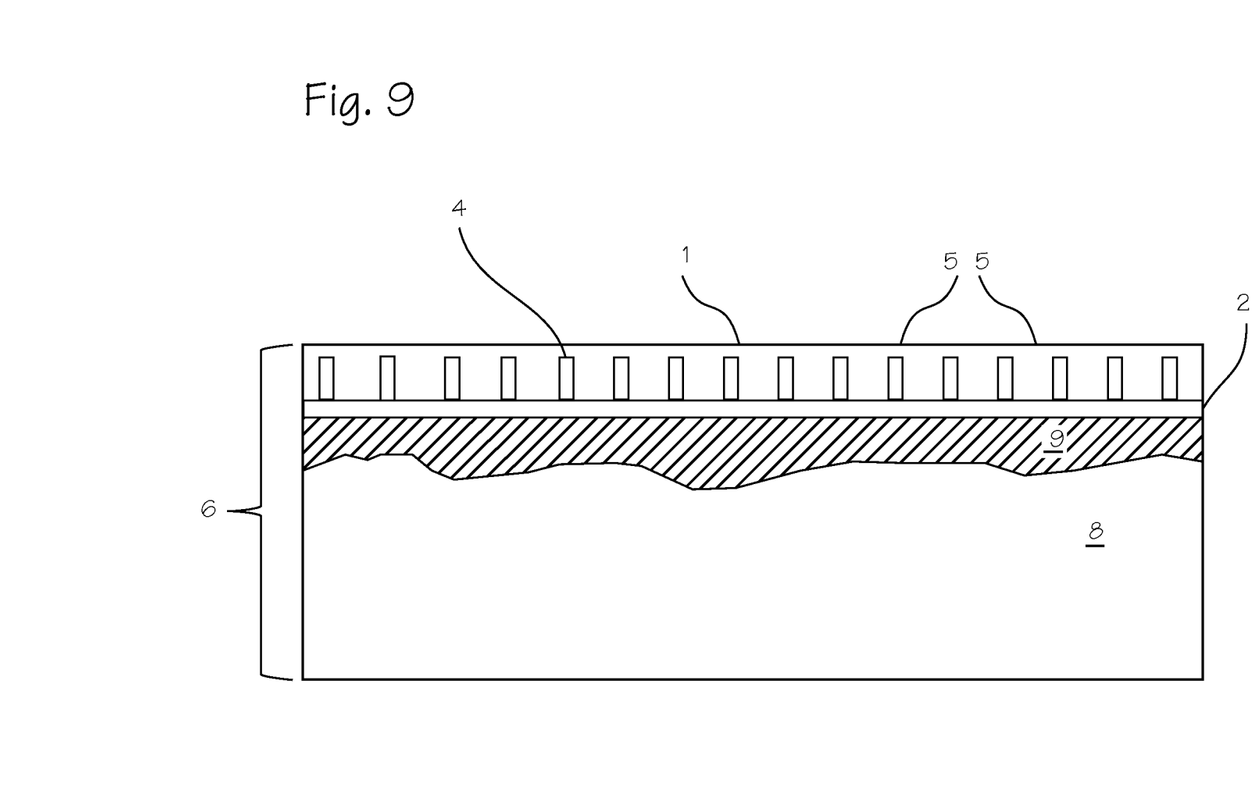
FIG. 9 illustrates the end product of the new method, which is an intermediate product of the entire integrated circuit in which it will be used.
Figure 10:
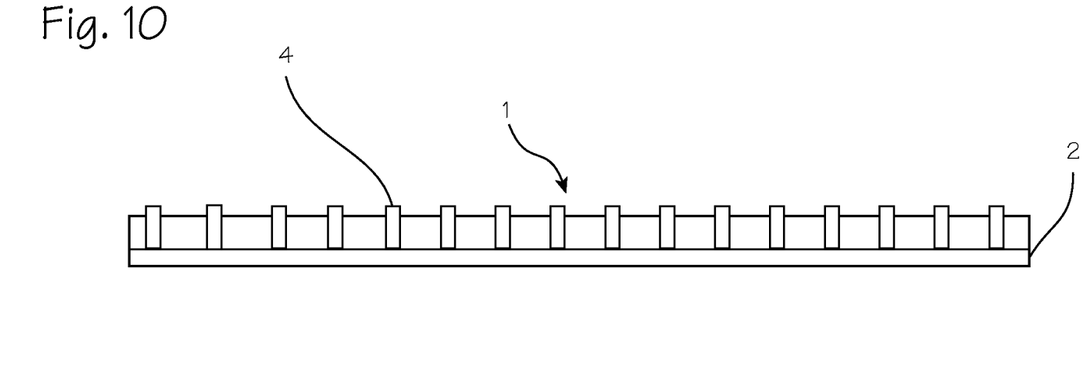
FIG. 10 illustrates a finished device wafer

FIG. 9 illustrates the end product of the new method, which is an intermediate product of the entire integrated circuit in which it will be used. This wafer stack will be coated with silicon oxide to prevent migration of copper into the silicon base layer, and then will be polished, to remove more of the base layer, until the copper TSV's protrude 2 to 5 microns over the remaining silicon. Eventually, after vias are exposed, the carrier wafer is removed, to leave the device as illustrated in FIG. 10, which is a finished device wafer. The adhesive may be degraded with ultraviolet light if the carrier wafer is made of glass and fixed to the device with UV-degradable adhesive, or with high heat if the carrier wafer is made of silicon and fixed with thermoset adhesive.

The steps of the procedure comprise the following:

PREPARE THE WAFER STACK: Mount Device Wafer with TSV's to a Carrier Wafer by adhering surfaces together with a joining force equal to or greater than the subsequent grinding down force. Glue should not deflect under the subsequent grind force and Must be selected to be resistant to grinding temperatures. The surface of the Device Wafer to be ground should be exposed.

MOUNT WAFER STACK TO GRIND WORK CHUCK with carrier wafer face-up (such that the Carrier Wafer surface is exposed to the grinding process). Use vacuum to firmly attach the wafer stack to the chuck. Vacuum level must be sufficient enough to induce the wafer stack to assume the shape of the grind work chuck as well as to eliminate any slippage between the wafer stack and the grind chuck.

GRIND FACE OF CARRIER WAFER while stack is being held firmly to the work chuck by vacuum. Remove at least as much material as is equivalent to combined adhesive and carrier wafer total thickness variation (TTV).

REMOVE WAFER STACK from the grind work chuck AND CLEAN both sides of the wafer stack. Clean the grind work chuck surface.

FLIP THE CLEANED WAFER STACK.

MOUNT FLIPPED, CLEANED WAFER STACK ONTO THE GRIND WORK CHUCK (the Device Wafer is now exposed to the grinding process). Use vacuum to firmly attach the wafer stack to the chuck. Vacuum level must be sufficient enough to induce the wafer stack to assume the shape of the grind work chuck.

GRIND DEVICE WAFER TO DESIRED RST AMOUNT

CLEAN THE WAFER STACK.

ETCH AND/OR POLISH THE DEVICE WAFER TO EXPOSE THE TSV'S. (This etch/polish may be done on the grind tool or on a separate tool.)

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

We claim:

1. A method of processing a device wafer comprising the steps of:
    gluing a carrier wafer to a front side of a device wafer to provide a wafer stack, leaving a backside of the device wafer exposed;
    mounting the wafer stack to a chuck, with the device wafer backside pulled down on the chuck, leaving an exposed side of the carrier wafer exposed to a grinder;
    grinding the exposed side of the carrier wafer till flat and smooth, and parallel to the backside of the device wafer;
    removing the wafer stack from the chuck, and thereafter mounting the wafer stack to the chuck with the exposed side of the carrier wafer pulled down on the chuck, so that the device wafer backside is exposed to the grinder;
    grinding the device wafer backside to remove silicon from the device wafer backside without exposing a copper thru silicon via in the device wafer.

* * * * *